United States Patent

Chen et al.

[11] Patent Number: 6,025,273
[45] Date of Patent: Feb. 15, 2000

[54] METHOD FOR ETCHING RELIABLE SMALL CONTACT HOLES WITH IMPROVED PROFILES FOR SEMICONDUCTOR INTEGRATED CIRCUITS USING A CARBON DOPED HARD MASK

[75] Inventors: Chao-Cheng Chen, Matou; Chia-Shiung Tsai; Hun-Jan Tao, both of Hsin-Chu, all of Taiwan

[73] Assignee: Taiwan Semiconductor Manufacturing Company, Ltd., Hsin-Chu, Taiwan

[21] Appl. No.: 09/055,433

[22] Filed: Apr. 6, 1998

[51] Int. Cl.[7] .................................................. H01L 21/283
[52] U.S. Cl. .......................... 438/706; 438/710; 438/712
[58] Field of Search ................................. 438/712, 710, 438/637, 624, 736; 134/1.2

[56] References Cited

U.S. PATENT DOCUMENTS

| | | | |
|---|---|---|---|
| 4,885,106 | 12/1989 | Lapham et al. | 252/100 |
| 4,975,144 | 12/1990 | Yamazaki et al. | 156/643 |
| 5,201,993 | 4/1993 | Langley | 156/643 |
| 5,223,443 | 6/1993 | Chinn et al. | 134/1.2 |
| 5,269,879 | 12/1993 | Rhoades et al. | 438/712 |
| 5,336,365 | 8/1994 | Goda et al. | 438/712 |
| 5,410,174 | 4/1995 | Kalnitsky | 257/384 |
| 5,441,901 | 8/1995 | Candelaria | 438/317 |
| 5,554,565 | 9/1996 | Liaw et al. | 438/233 |
| 5,563,098 | 10/1996 | Kuo et al. | 437/191 |
| 5,656,128 | 8/1997 | Hashimoto et al. | 216/47 |

OTHER PUBLICATIONS

"Synthesis of Si C Microstructures in Si Technology by High Dose Carbon Implantation: Etch–Stop Properties" by C. Serre et al. J. Electrochem. Soc. vol. 144, No. 6, Jun. 1997, pp. 2211–2215.

Primary Examiner—Benjamin L. Utech
Assistant Examiner—Lan Vinh
Attorney, Agent, or Firm—George O. Saile; Stephen B. Ackerman

[57] ABSTRACT

A method is achieved for fabricating small contact holes in an interlevel dielectric (ILD) layer for integrated circuits. The method increases the ILD etch rate while reducing residue build-up on the contact hole sidewall. This provides a very desirable process for making contact holes small than 0.25 um in width. After depositing the ILD layer over the partially completed integrated circuit which includes patterned doped first polysilicon layers, a second polysilicon layer is deposited and doped with carbon by ion implantation. A photoresist mask is used to etch openings in the carbon doped polysilicon layer to form a hard mask. The photoresist is removed, and the contact holes are plasma etched in the ILD layer while free carbon released from the hard mask, during etching, reduces the free oxygen in the plasma. This results in an enhanced fluorine ($F^+$) etch rate for the contact holes in the ILD layer and reduces the residue build-up on the sidewalls of the contact holes. The hard mask is anneal in $O_2$ to form an oxide layer and any surface carbon is removed in a wet etch. Reliable metal plugs can now be formed by depositing a barrier layer, such as titanium (Ti) or titanium nitride (TiN) and a metal such as tungsten (W) and etching back or chemical/mechanical polishing back to the oxide layer.

22 Claims, 3 Drawing Sheets

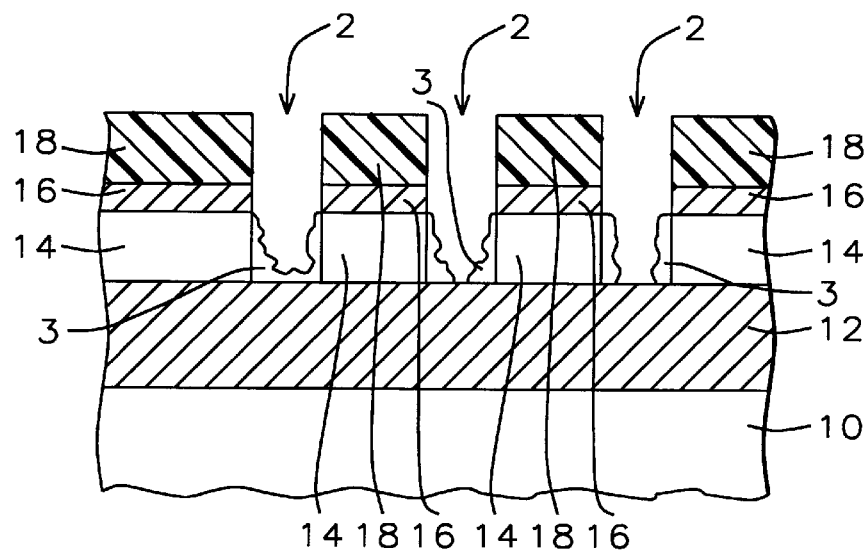
*FIG. 1 - Prior Art*
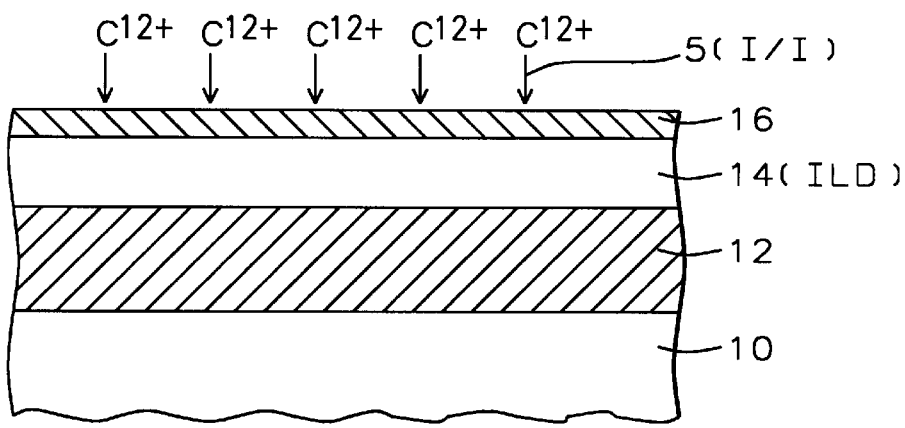
*FIG. 2*

METHOD FOR ETCHING RELIABLE SMALL CONTACT HOLES WITH IMPROVED PROFILES FOR SEMICONDUCTOR INTEGRATED CIRCUITS USING A CARBON DOPED HARD MASK

BACKGROUND OF THE INVENTION (1) Field of the Invention

This invention relates to semiconductor integrated circuit devices, and is directed to a method of forming small (subquarter-micrometer) closely spaced contacts for electrical interconnections on Ultra Large Scale Integration (ULSI) circuits. More specifically, the method uses a carbon doped hard mask to achieve a high density of small contacts with improved silicon oxide etch rates and improved profiles in the contact holes.

(2) Description of the Prior Art

In recent years, the integrated circuit density on the semiconductor substrate has dramatically increased. This increase in density has resulted from down scaling of the individual devices built in and on the substrate and the interconnecting patterned electrical conducting layers that are used to wire up the devices. Future requirements for even greater increases in packing density is putting additional demand on the semiconductor technologies, such as improved resolution in the photolithography and improved plasma etching techniques.

One processing area limiting the packing density is the fabrication of reliable closely spaced small contacts or via holes in the interlevel dielectric (ILD) layer over the patterned electrical conducting polysilicon or polycide (polysilicon/silicide) layers used to interconnect the discrete devices on the semiconductor substrate. When the contact hole image size is less than 0.25 micrometers (um) it is necessary to use much shorter wavelength ultraviolet (UV) light (for example, having 193 nanometer wavelengths) to expose the latent images in the photoresist layer that is then developed and used as the etch mask for the contact hole. This necessitates using an exposure tool having a large numerical aperture (NA) which with a much shallower depth of focus (DOF). As a result the next generation of process technology will require much thinner photoresist layers (e.g. as thin as 0.76 um) to achieve the required high resolution. Unfortunately, the interlevel dielectric layers (ILD) must remain reasonably thick to minimize the ILD capacitance, and hence the RC circuit delays. This results in aspect ratios for these small contact holes (depth/width) which can be quite large. Therefore it is becoming increasingly difficult to etch the deep contact hole without eroding away the relatively thin photoresist mask when the contact or via hole are etched.

One solution to this problem is to include a polysilicon hard mask under the thin photoresist mask to prevent punch through in the ILD layer (insulating layer). However, when a photoresist mask/polysilicon hard mask is used the plasma etching usually results in a non-volatile residue buildup on the sidewalls of the contact hole. For example, Kuo et al., in U.S. Pat. No. 5,563,098 teaches a method for making buried contacts in a substrate using a polysilicon hard mask. The polymer buildup that usually forms on the sidewall in the opening of a polysilicon layer is first removed with the photoresist mask by oxygen plasma ashing prior to implanting the contact. Another method for making buried contacts structure in which the contact is etched through polysilicon (hard mask) layer and a oxide is described by Kalnitsky in U.S. Pat. No. 5,410,174. In U.S. Pat. No. 5,201,993 by Langley a two step plasma etch process is described for patterning multi-structure of oxide/silicide/polysilicon with vertical profiles. Still another approach for improving the photoresist image fidelity is described by Hasimoto et al in U.S. Pat. No. 5,656,128 in which an amorphous carbon film is used as an anti-reflecting coating (ARC) under the photoresist mask. And in U.S. Pat. No. 4,975,144, by Yamazaki et al., a method is described for selectively removing an amorphous carbon film on a substrate after processing or on the surfaces in the plasma chamber using NF3 plasma etch. Another use of carbon implanted in a single crystal silicon substrate for making microstructures is described in "Synthesis of SiC Microstructures in Si Technology by High Dose Carbon Implantation: Etch-Stop Properties" by C. Serre et al., J. Electrochem. Soc. Vol 144, No. Jun. 6, 1997 pages 2211–2215. None of the above methods addresses the need to minimize residue build during etching which is crucial to the formation of very small vertical walled contact or via holes.

Therefore, there is still a problem when using a polysilicon hard mask for etching very small closely spaced contact holes with or without the photoresist. Local loading effects and the redeposition of non-volatile inorganics, such as $SiO_x$, can result in non-repeatable and unreliable contact openings. This is best depicted with reference to FIG. 1, which shows several closely spaced contacts 2 etched in a ILD layer. Shown are the contact openings 2 plasma etched in a ILD oxide layer 14 to a polysilicon layer 12 on substrate 10. During plasma etching the patterned photoresist layer 18 used as the etch mask can result in polymeric residue buildup 5 on the sidewalls of the contact holes 2. When a polysilicon hard mask 16 is include inorganic contamination can also build up as residue 5 on the sidewalls of the contact holes, such as $SiO_x$. These residues build-up results in rough sidewalls, and reduce the contact hole width. The release of excessive oxygen during the ILD etching lower the oxide etch rates. These effects prevent the formation of metal plugs in the contact holes with repeatable and reliable low contact resistance.

Therefore, there is still a strong need in the semiconductor industry for a contact hole etch process that reduces the sidewall residue during etching and enhances the oxide etch to provide reliable closely spaced very small contact holes (less than 0.25 um) in insulating layer for ULSI circuits.

SUMMARY OF THE INVENTION

A principal object of this invention is to provide process for making small (<0.25 um) closely spaced contact holes in an insulating layer, such as in an interlevel dielectric (ILD) layer, with reduced contamination build-up in the contact hole and with increased oxide etch rates.

It is another object of the present invention to provide this process for forming the small contact holes using a polysilicon hard mask implanted with carbon ions.

It is still another object of this invention to convert the remaining carbon implanted hard mask to a silicon oxide layer that remain as part of the ILD layer.

In accordance with the objects of this invention, a method is described for forming very small contacts holes in the interlevel dielectric layers over a patterned electrically conducting layer. The method begins by providing a semiconductor substrate having partially completed device structures including, in part, a patterned electrically conducting layer consisting of a conductively doped first polysilicon layer. The patterned doped polysilicon layer is used in part as the electrical interconnections on the ULSI circuits. A interlevel dielectric (ILD) layer is deposited on the electrically conducting layer and a second polysilicon layer is deposited on the ILD layer as a hard mask. The ILD layer is typically a silicon oxide ($SiO_2$) or doped glass, such as borophosphosilicate glass (BPSG), and is deposited by low pressure chemical vapor deposition (LPCVD) using a reactant gas such as TEOS. The second polysilicon layer which is also deposited by CVD is ion implanted with carbon to form a carbon doped polysilicon layer. A bottom anti-reflecting coating (BARC) is deposited and a photoresist layer is spin-coated over the carbon doped polysilicon layer. The photoresist layer is then exposed and developed to form openings for the contact holes. Anisotropic plasma etching is used to etch openings in the carbon doped polysilicon layer to the interlevel dielectric (ILD) layer using the patterned photoresist as the etch mask. The openings in the polysilicon hard mask are plasma etched using a low selectivity etch recipe, and the photoresist mask is then removed by plasma ashing in oxygen. Alternatively, the contact holes can be etched in the ILD layer prior to removing the photoresist mask. The carbon doped polysilicon layer is then used as a hard mask to etch the contact holes in the ILD layer to the electrically conducting layer (doped first polysilicon layer). Now, unique to this invention, the carbon (C) atoms are released from the carbon doped polysilicon hard mask during the contact hole etching in the ILD layer. This free carbon reduces the free oxygen, and thereby reduces contamination buildup in the contact openings and increases the etch rate of the ILD layer. The hard mask is then annealed in an oxidizing atmosphere and converted to silicon oxide layer. Concurrently, the exposed first polysilicon layer in the contact holes is oxidized. After removing any residual carbon remaining on the silicon oxide layer in a wet etch, a blanket anisotropic plasma etch is used to remove the oxide in the contact hole, and portions of silicon oxide layer on the ILD layer. Then metal plugs are formed in the contact holes for the next level of interconnection. For example, the metal plugs can be formed by depositing a barrier layer, such as titanium (Ti) or titanium nitride (TiN) over and in said contact openings. A tungsten layer is deposited to fill the holes and is etched back or polished back by chemical/mechanical polishing (CMP) to form the metal plugs.

BRIEF DESCRIPTION OF THE DRAWINGS

The objects and advantages of this invention are best understood by the following embodiment and with reference to the attached drawings which are now briefly described.

FIG. 1 is a schematic cross sectional view of a interlevel dielectric (ILD) layer having several closely spaced small contact holes depicting the residue build-up in the contact hole resulting from the prior art.

FIGS. 2 through 6 is a schematic cross sectional view of a interlevel dielectric (ILD) layer having several closely spaced small contact holes depicting the sequence of process step for making the residue-free contact holes in the ILD layer by the method of this invention.

DESCRIPTION OF THE PREFERRED EMBODIMENTS

Figure 3:
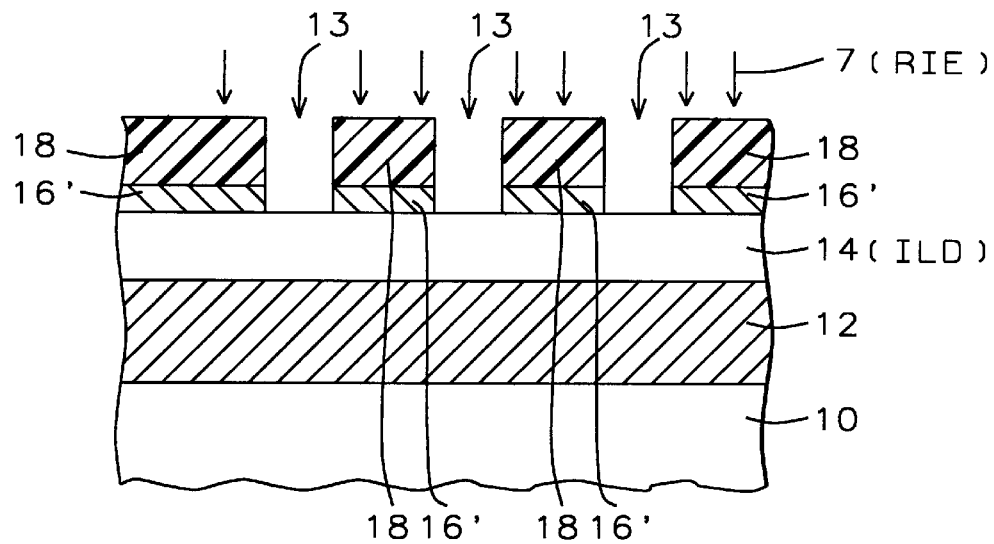

Now in keeping with the objects of this invention, the method of making these very small contact holes in a ILD layer with reduced sidewall residue and increased etch rates is described in detail. This invention can be used on various types of integrated circuits currently manufactured on semiconductor substrates in the industry. Therefore only those details of the process and structure necessary for making and understanding the invention are described in detail.

Referring now to FIG. 2, the method begins by providing a semiconductor substrate 10 having a partially completed device structures which, in part, include a patterned electrically conducting layer 12. Typically the conducting layer 12 is a doped first polysilicon 12 and is deposited by chemical vapor deposition (CVD) using silane (SiH4) as the reactant gas. The layer 12 is doped with an N-type conductive dopant such as arsenic, phosphorus, or a P-type dopant, such as boron and is typically doped to a concentration of between about 1.0 E 19 and 1.0 E 21 atoms/$cm^3$. The preferred thickness of layer 12 is between about 2000 and 3000 Angstroms. The layer 12 is then patterned, using conventional photolithographic techniques and plasma etching, to form part of the electrical interconnections.

An interlevel dielectric (ILD) layer 14 is then deposited on the patterned first polysilicon layer 12 to provide the next of insulation. The ILD layer 14 is preferably composed of a silicon oxide ($SiO_2$) and is deposited by low pressure chemical vapor deposition (LPCVD) or by plasma enhanced CVD (PECVD) using a reactant gas such as tetraethosiloxane (TEOS) and ozone ($O_3$). Alternatively, ILD layer 14 can be doped with boron and phosphorus to form a borophosphosilicate glass. The ILD layer 14 is deposited to a thickness of between about 6000 and 1000 Angstroms.

Still referring to FIG. 2, a second polysilicon layer 16 is deposited on the ILD layer 14 as a hard mask. Layer 16 is deposited similar to the first polysilicon layer 12 using LPCVD and a reactant, such as silane. Layer 16 is deposited to a preferred thickness of between about 1000 and 2000 Angstroms. Now, by the method of this invention, the polysilicon layer 16 is implanted with carbon ions to form a carbon doped polysilicon layer 16'. The preferred implant doses of the carbon ions ($C^{12}+$) is between about 1.0 E 17 and 5.0 E 17 ions/$cm^3$ and is implanted at an ion energy of between about 200 and 400 Kev and, more specifically at an implant energy of about 300 Kev.

Referring now to FIG. 3, a bottom anti-reflecting coating (BARC) (not depicted as a separate layer in the FIG.) and a photoresist layer 18 is coated on the carbon doped polysilicon layer 16' and patterned by conventional photolithographic means to form a photoresist mask 18 with openings for etching the contact holes. The preferred BARC layer is composed of an organic ARC layer and is deposited to a thickness necessary to minimize the optical reflection of the radiation used to expose the photoresist.

Still referring to FIG. 3, the patterned photo-resist mask 18 and an anisotropic plasma etch are used to etch openings in the carbon doped polysilicon layer 16' to the ILD layer 14 to provide a carbon doped hard mask, also labeled 16'. The etching of layer 16' is preferably carried out using a reactive ion etching (RIE) or in a high density plasma etcher (HDP-etcher) and is etched using a low selectivity etching recipe consisting of the etchant gases, preferably chlorine ($Cl_2$) and hydrogen bromide (HBr). Alternatively carbon tetrafluoride ($CF_4$) can be used as the etchant gas.

Figure 4:
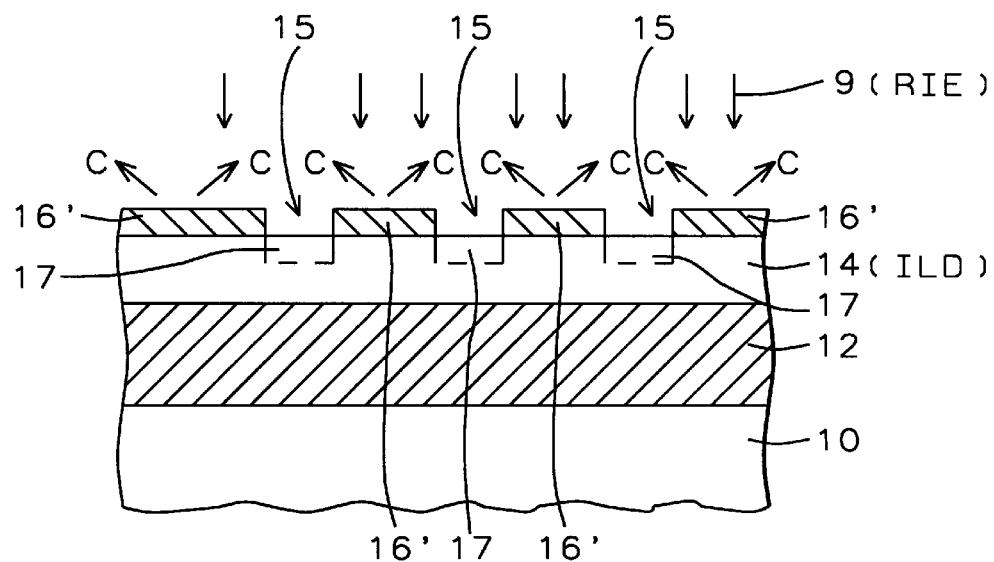
Figure 5:
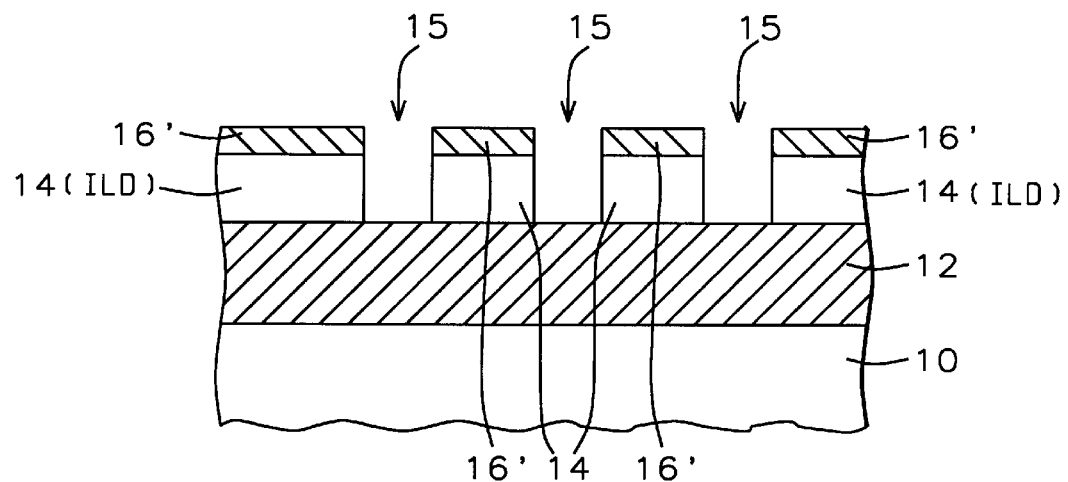

Now as shown in FIG. 4, the photoresist mask 18 is removed, for example by plasma ashing in oxygen ($O_2$). A second anisotropic plasma etch is used to etch the contact holes (or via holes) 15 in the ILD layer 14 using the carbon doped layer 16' as the etch mask. The contact holes 15 are etched using a HDP-etcher and a preferred etchant gas mixture consisting of one or more of the following: $CF_4$, $CHF_3$, $C_2F_6$, and $C_4F_8$. An important feature of this inventions is that the release of the carbon C atoms from the hard mask 16' during the plasma etching of ILD layer 14 ($SiO_2$) minimizes the free oxygen during etching. For example, by forming the volatile gases CO and $CO_2$. This savaging of the free $O_2$ effectively enhances the fluorine ($F^+$) etch rate, thereby increasing the local etch rate of the oxide layer 14 while minimizing the buildup of non-volatile residue, such as $SiO_x$, on the sidewalls of the contact holes 15 during etching. FIG. 4 depicts the partially etched contact holes 15 by the dashed lines 17, and FIG. 5 depicted the closely spaced, small contact holes 15 after the etching is completed. This etch process using a carbon hard mask results in high-aspect-ratio contact holes with vertical sidewalls. Alternatively, the contact holes can be etched in the ILD layer 14 prior to removing the photoresist mask 18. If or when the photoresist mask 18 the hard mask 16' prevents oxide punch-through and the free carbon enhances the oxide etch rate and prevents residue build-up.

Figure 6:
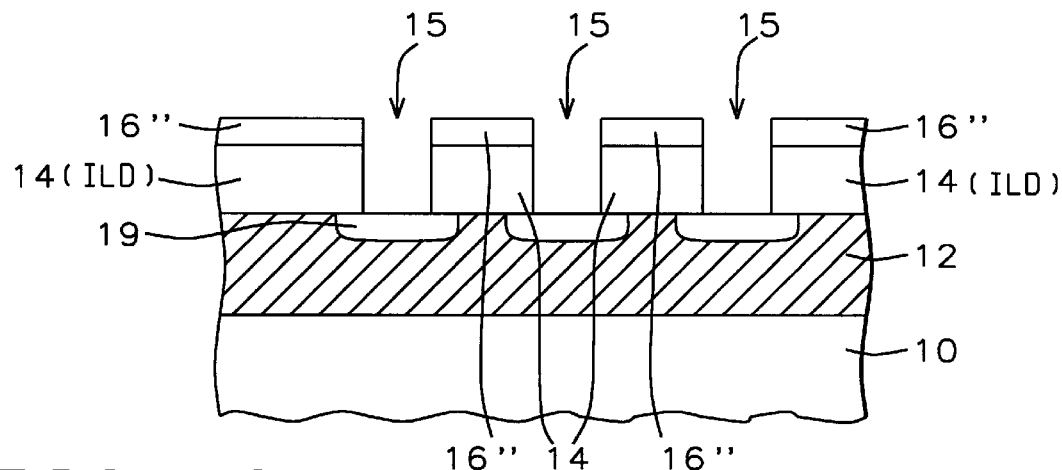

Now as shown in FIG. 6, the hard mask 16' is annealed in an oxidizing atmosphere and converted to silicon oxide layer 16". For example, the annealing can be carried out in $O_2$ at a temperature of about 800° C. or higher for a time sufficient to totally oxidize the layer 16'. Since the polysilicon layer 12 is concurrently oxidized in the contact holes 15 to form the oxide layer 19, a second anisotropic plasma etch is used which also removes portions of the carbon doped oxide layer 16".

Figure 7:
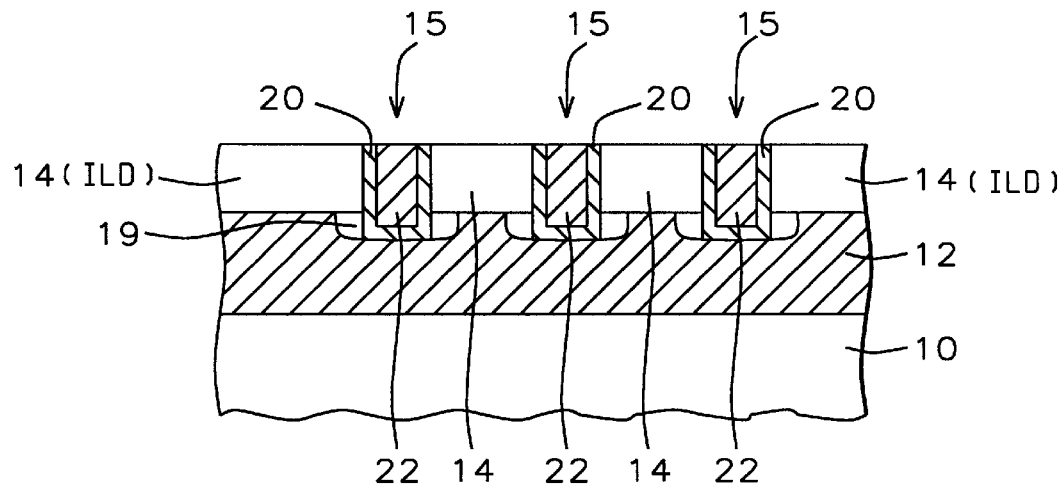
FIGS. 7 is a schematic cross sectional view of a interlevel dielectric (ILD) layer having metal plugs formed in these improved small contact holes in the ILD layer by the method of this invention.

Referring to FIG. 7, any remaining carbon on the surface of the oxide layer 16" is removed using an appropriate wet etch. For example, the carbon can be removed by etching in a solution of sulfuric acid ($H_2SO_4$) and hydrogen peroxide ($H_2O_2$).

Still referring to FIG. 7, metal plugs are formed in the contact holes for the next level of interconnection. For example, the metal plugs can be formed by depositing a barrier layer 22, such as titanium (Ti) or titanium nitride (TiN) over and in said contact openings 15. The Ti or TiN can be deposited by CVD or by physical vapor deposition (PVD). Layer 22 is deposited to a preferred thickness of between about 400 and 900 Angstroms. A tungsten (W) layer 22 is deposited to fill the contact openings 15. For example, the W can be deposited by CVD using tungsten hexafluoride ($WF_6$) as the reactant. The W is then etched back to the surface the ILD layer 14 to form the plugs 22, as shown in FIG. 7. Alternatively, the W can be polished back using chemical/mechanical polishing commonly practiced in the industry.

While the invention has been particularly shown and described with reference to the preferred embodiments thereof, it will be understood by those skilled in the art that various changes in form and details may be made without departing from the spirit and scope of the invention.

What is claimed is:

1. A method for fabricating improved contact holes in an interlevel dielectric (ILD) layer on a semiconductor substrate for integrated circuits, comprising the steps of:

providing a semiconductor substrate having partially completed device structures including a patterned electrically conducting layer;

depositing said interlevel dielectric (ILD) layer on said electrically conducting layer;

depositing a polysilicon layer on said interlevel dielectric (ILD) layer;

ion implanting carbon in said polysilicon layer to form a carbon doped polysilicon layer;

forming a patterned photoresist layer having openings on said carbon doped polysilicon layer for said contact holes;

anisotropic plasma etching openings in said carbon doped polysilicon layer to said interlevel dielectric (ILD) layer in said openings of said photoresist;

anisotropically plasma etching using said carbon doped polysilicon layer as a hard mask to etch said contact openings in said interlevel dielectric layer to said electrically conducting layer, whereby said carbon atoms released from said carbon doped polysilicon layer during said etching, minimizes contamination buildup in said contact openings and increases the etch rate of said interlevel dielectric layer;

removing said photoresist layer;

annealing in an oxidizing atmosphere and converting said polysilicon hard mask to a silicon oxide layer;

blanket anisotropic plasma etching to remove any oxide formed on said conductive layer exposed in said contact holes;

cleaning any residual carbon atoms from the surface of said silicon oxide layer by wet etching, and completing said interlevel dielectric (ILD) layer having said improved contact holes.

2. The method of claim 1, wherein the electrically conducting layer is composed of conductively doped polysilicon having a thickness of between about 2000 and 3000 Angstroms.

3. The method of claim 1, wherein said interlevel dielectric layer is composed of borophosphosilicate glass (BPSG) having a thickness of between about 6000 and 10000 Angstroms.

4. The method of claim 1, wherein said interlevel dielectric layer is silicon oxide ($SiO_2$) deposited by plasma enhance chemical vapor deposition using tetraethosiloxane (TEOS) as the reactant gas.

5. The method of claim 1, wherein said polysilicon layer has a thickness of between about 1000 and 2000 Angstroms.

6. The method of claim 5, wherein said polysilicon layer is ion implanted with carbon (C) at a dose of between 1.0 E 17 and 5.0 E 17 atoms/$cm^2$ and at a implant energy of between about 200 and 400 KeV.

7. The method of claim 1, wherein said openings in said carbon doped polysilicon layer are etched using reactive ion etching (RIE) and an etchant gas mixture composed of chlorine and hydrogen bromide.

8. The method of claim 1, wherein said contact holes in said interlevel dielectric layer are etched using a high density plasma (HDP) etcher and an etchant gas mixture composed of at least one of the group consisting of $CF_4$, $CHF_3$, $C_2F_6$, and $C_4F8$.

9. The method of claim 1, wherein said annealing is carried out in an oxygen ambient at a temperature of at least 800 degrees centigrade.

10. The method of claim 1, wherein any said residual carbon atoms are removed from the surface of said silicon oxide using a solution of sulfuric acid ($H_2SO_4$) and hydrogen peroxide ($H_2O_2$).

11. A method for fabricating an interlevel dielectric (ILD) layer having improved metal plug contacts on a semiconductor substrate for integrated circuits, comprising the steps of:

providing a semiconductor substrate having partially completed device structures including a patterned electrically conducting layer;

depositing said interlevel dielectric (ILD) layer on said electrically conducting layer;

depositing a polysilicon layer on said interlevel dielectric (ILD) layer;

ion implanting carbon in said polysilicon layer to form a carbon doped polysilicon layer;

forming a patterned photoresist layer having openings on said carbon doped polysilicon layer for said contact holes;

anisotropic plasma etching openings in said carbon doped polysilicon layer to said interlevel dielectric (ILD) layer in said openings of said photoresist;

anisotropically plasma etching using said carbon doped polysilicon layer as a hard mask to etch said contact openings in said interlevel dielectric layer to said electrically conducting layer, whereby said carbon released from said carbon doped polysilicon layer, during said etching, minimizes contamination buildup in said contact openings and increases the etch rate of said insulating layer;

removing said photoresist layer;

annealing in an oxidizing atmosphere and converting said polysilicon hard mask to a silicon oxide layer;

blanket anisotropic plasma etching to remove any oxide formed on said conductive layer exposed in said contact holes;

cleaning any residual carbon atoms from the surface of said silicon oxide layer by wet etching;

depositing a barrier layer over and in said contact openings;

forming metal plug contacts in said contact openings.

12. The method of claim 11, wherein the electrically conducting layer is composed of conductively doped polysilicon having a thickness of between about 2000 and 3000 Angstroms.

13. The method of claim 11, wherein said interlevel dielectric layer is composed of borophosphosilicate glass (BPSG) having a thickness of between about 6000 and 10000 Angstroms.

14. The method of claim 11, wherein said interlevel dielectric layer is silicon oxide ($SiO_2$) deposited by plasma enhanced chemical vapor deposition (PECVD) using tetra-ethosiloxane as the reactant gas.

15. The method of claim 11, wherein said polysilicon layer has a thickness of between about 1000 and 2000 Angstroms.

16. The method of claim 15, wherein said polysilicon layer is ion implanted with carbon (C) at a dose of between 1.0 E 17 and 5.0 E 17 atoms/$cm^2$ and at a implant energy of between about 200 and 400 KeV.

17. The method of claim 11, wherein said openings in said carbon doped polysilicon layer are etched using reactive ion etching (RIE) and an etchant gas mixture composed of chlorine and hydrogen bromide.

18. The method of claim 11, wherein said contact holes in said interlevel dielectric layer are etched using a high density plasma (HDP) etcher and an etchant gas mixture composed of at least one of the group consisting of $CF_4$, $CHF_3$, $C_2F_6$, and $C_4F8$.

19. The method of claim 11, wherein said annealing is carried out in an oxygen ambient at a temperature of at least 800 degrees centigrade.

20. The method of claim 11, wherein any said residual carbon atoms are removed from the surface of said silicon oxide using a solution of sulfuric acid ($H_2SO_4$) and hydrogen peroxide ($H_2O_2$).

21. The method of claim 11, wherein said barrier layer is titanium nitride (TiN) and has a thickness of between about 400 and 900 Angstroms.

22. The method of claim 11, wherein said metal plug contacts are composed of tungsten (W) and are formed by depositing a tungsten film sufficient to fill the contact holes and is then blanket etched back to the silicon oxide layer.

* * * * *